United States Patent
Bräysy et al.

(10) Patent No.: US 10,675,834 B2
(45) Date of Patent: Jun. 9, 2020

(54) INTEGRATED MULTILAYER STRUCTURE FOR USE IN SENSING APPLICATIONS AND METHOD FOR MANUFACTURING THEREOF

(71) Applicant: TactoTek Oy, Oulunsalo (FI)

(72) Inventors: Vinski Bräysy, Oulunsalo (FI); Anne Isohätälä, Oulunsalo (FI); Jarmo Sääski, Oulunsalo (FI); Tomi Simula, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/193,360

(22) Filed: Nov. 16, 2018

(65) Prior Publication Data
US 2020/0061956 A1 Feb. 27, 2020

Related U.S. Application Data

(62) Division of application No. 16/113,335, filed on Aug. 27, 2018.

(51) Int. Cl.
*G06F 3/045* (2006.01)
*B32B 3/30* (2006.01)
(Continued)

(52) U.S. Cl.
CPC .............. *B32B 3/30* (2013.01); *B32B 27/08* (2013.01); *G06F 3/044* (2013.01);
(Continued)

(58) Field of Classification Search
None
See application file for complete search history.

(56) References Cited

U.S. PATENT DOCUMENTS 3,643,041 A * 2/1972 Jackson .............. H01H 13/702
200/5 A
3,898,421 A * 8/1975 Suzumura ........... H01H 13/702
200/517
(Continued)

OTHER PUBLICATIONS

What is polyurethane?, http://polyurethanes.org/en/what-is-it, ISOPA, 2019, p. 1 (Year: 2019).*
(Continued)

*Primary Examiner* — Lunyi Lao
*Assistant Examiner* — Kirk W Hermann
(74) *Attorney, Agent, or Firm* — Robert P. Michal, Esq.; Carter, DeLuca & Farrell LLP

(57) ABSTRACT

A method for manufacturing an integrated multilayer structure for sensing applications, including obtaining at least one film including a sensing area; arranging the at least one film with reactance sensing electronics for sensing of one or more selected target quantities or qualities and conversion thereof into representative electrical signals, said sensing electronics including at least one sensing element and an electrical connection configured to connect the sensing element to an associated control circuitry; and molding or casting, and configuring, at least one plastic layer so that the plastic layer defines an integrated, intermediate layer between the sensing electronics and the sensing area and that the sensing area is superimposed with the sensing element of the sensing electronics, wherein it is further provided at least one physical feature to locally reduce the electrical distance between the sensing area and the sensing element to improve the associated sensing sensitivity.

13 Claims, 9 Drawing Sheets

(51) Int. Cl.
    *B32B 27/08*     (2006.01)
    *G06F 3/044*     (2006.01)
    *B29C 45/16*     (2006.01)
    *B29L 31/34*     (2006.01)

(52) U.S. Cl.
    CPC ....... *B29C 45/1679* (2013.01); *B29L 2031/34* (2013.01); *B32B 2457/00* (2013.01); *G06F 2203/04103* (2013.01)

(56) References Cited

U.S. PATENT DOCUMENTS

| | | | |
|---|---|---|---|
| 2003/0116418 A1 | 6/2003 | Lin | |
| 2003/0136650 A1* | 7/2003 | Lai | H01H 13/7006 200/1 B |
| 2006/0131156 A1* | 6/2006 | Voelckers | G06F 3/0234 200/512 |
| 2007/0119698 A1 | 5/2007 | Day | |
| 2007/0221483 A1* | 9/2007 | Pihlaja | G06F 3/0338 200/5 R |
| 2008/0018611 A1 | 1/2008 | Serban et al. | |
| 2009/0008234 A1* | 1/2009 | Tolbert | H01H 13/702 200/600 |
| 2009/0140996 A1* | 6/2009 | Takashima | G06F 1/1626 345/173 |
| 2011/0182458 A1* | 7/2011 | Rosener | H04R 1/1041 381/384 |
| 2013/0020186 A1 | 1/2013 | Lai | |
| 2013/0082970 A1* | 4/2013 | Frey | G06F 3/0414 345/173 |
| 2014/0225855 A1* | 8/2014 | Aitchison | G06F 3/041 345/173 |
| 2014/0266250 A1 | 9/2014 | Wallace et al. | |
| 2014/0292396 A1* | 10/2014 | Bruwer | H03K 17/955 327/517 |
| 2015/0257278 A1* | 9/2015 | Niskala | H05K 3/1216 361/749 |
| 2015/0357078 A1* | 12/2015 | Lessing | G01L 1/20 73/774 |
| 2016/0290878 A1* | 10/2016 | Severinkangas | G01L 1/146 |
| 2016/0313858 A1* | 10/2016 | Chan | G06F 3/044 |
| 2017/0068331 A1 | 3/2017 | Tomokiyo et al. | |
| 2017/0094800 A1* | 3/2017 | Keranen | H05K 1/0269 |
| 2017/0135198 A1 | 5/2017 | Keranen et al. | |
| 2017/0372853 A1* | 12/2017 | Taniguchi | H01H 11/0012 |
| 2018/0046267 A1 | 2/2018 | Kobayashi | |
| 2018/0150138 A1 | 5/2018 | Kim et al. | |

OTHER PUBLICATIONS

Office Action issued in U.S. Appl. No. 16/113,335 dated Oct. 28, 2019 (22 pages).
Office Action issued in U.S. Appl. No. 16/113,335 dated Aug. 16, 2019 (31 pages).
International Search Report issued by the European Patent Office acting as the International Searching Authority in relation to International Application No. PCT/FI2019/050602 dated Dec. 19, 2019 (4 pages).
Written Opinion of the International Searching Authority issued by the European Patent Office acting as the International Searching Authority in relation to International Application No. PCT/FI2019/050602 dated Dec. 19, 2019 (10 pages).
Office Action issued in U.S. Appl. No. 16/113,335 dated Oct. 24, 2018 (6 pages).
Office Action issued in U.S. Appl. No. 16/113,335 dated Feb. 27, 2020 (21 pages).

* cited by examiner

INTEGRATED MULTILAYER STRUCTURE FOR USE IN SENSING APPLICATIONS AND METHOD FOR MANUFACTURING THEREOF

CROSS-REFERENCE TO RELATED APPLICATIONS

This application is a divisional of U.S. patent application Ser. No. 16/113,335, filed Aug. 27, 2018 the entire disclosure of which is incorporated herein by reference.

FIELD OF THE INVENTION

Present invention relates generally to electronics, associated devices, structures and methods of manufacture. In particular, however not exclusively, the present invention concerns integrated multi layer structures having a functional structure containing a film layer and adjacent molded plastics layer integrated together being utilized in sensing applications, and methods for manufacture of such structures.

BACKGROUND

There exists a variety of different stacked assemblies and structures in the context of electronics and electronic products. The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) actually involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment.

It is common to have buttons or other control means in the electronic devices. These may be, for example, push buttons based on application of mechanical force, or reactance sensing devices, such as based on capacitive sensing. In some known solutions relatively large electrodes are being arranged on the surface or close to the surface of the device, such as on a printed circuit board (PCB). There may then be an additional layer arranged to cover the electrodes and the PCB. In order to operate the sensing device, an electric field may be produced at the sensing element, such as an electrode, and controlled such as to obtain sufficiently good signal to noise ratio in order to detect the presence of a finger or an object utilized to control the operation of the device, for instance.

The known solutions have disadvantages, such as with large electrodes it's challenging to design solutions with close by adjacent sensors. It also takes room from other electronics. Sensing sensitivity and interferences may cause various issues. Known solutions are constructed with separate components, thus increasing costs and assembly time. These components may further become loose when they are subject to pressures present in injection molding process. The resulting structures become more complicated affecting manufacturability.

SUMMARY

The objective of the present invention is to at least alleviate one or more of the above drawbacks associated with the existing solutions in the context of integral multilayer structures and electronics embedded therein.

The objective is achieved with various embodiments of a multilayer structure and related method of manufacture in accordance with the present invention.

According to one embodiment of the present invention, an integrated multilayer structure for use in sensing applications, optionally in the sensing of touch, proximity, gesture, and/or force, advantageously comprises at least one, e.g. molded or cast, plastic layer, preferably of electrically substantially insulating material, having a first and an opposing second side. The structure further comprises film layer on both first and second sides of said plastic layer. Furthermore, the film layer on the first side of said plastic layer is provided with (reactance) sensing electronics for reactance, such as (projected) capacitance or inductance, sensing of one or more selected target quantities and/or qualities and conversion thereof into representative electrical signals, the sensing electronics comprising at least one sensing element, such as an sensing electrode or a sensing coil, optionally printed upon the film layer, and an electrical connection, preferably a galvanic connection element or a capacitive connection or an inductive connection, for connecting the sensing element to an associated control circuitry preferably driving the sensing element, said structure optionally hosting at least part of the control circuitry, and the film layer on the second side of said plastic layer having a sensing area superimposed with, optionally substantially axially aligned with, the sensing element of the reactive sensing electronics. Still further, the electrical distance between the film layer on the second side of said plastic layer and the sensing element is locally reduced by at least one physical feature at the position of the sensing area of the film layer to improve the associated sensing sensitivity.

The film layer may be a film substrate, such as a ready-made laminate or a film layer manufactured by molding. Term "film layer" refers herein essentially to any substrate or piece of material which has dimensions such that the film layer is significantly thinner or shorter with respect to one of the three perpendicular directions, such as thin in z-direction, with respect to other dimensions, such as x- and y-directions. The film layer may thus be a planar-like element or substrate.

The film layer may form one layer of a multilayer structure, such as having at least two layers. The other layers may be, for example, laminated on the film layer. It may even be so that the film layer does not define or represent the most outermost layer of the multilayer structure but rather it may be laminated, for instance, on both sides of the film layer.

In some embodiments, at least a corresponding portion of the plastic layer with respect to the sensing area is preferably elastic. Such a structure having the elastic portion may thus be used for indirect measuring of force being applied to the sensing area.

In some embodiments, the at least one physical feature comprises an electrically conductive element substantially within said plastic layer, connecting to the sensing element.

In some embodiments, the conductive element comprises resin molded upon the sensing element.

The resin may be, for example, an electrically conductive polyester based thermoplastic polyurethane compound. The conductivity of the resin may be achieved and/or adjusted by utilizing conductive carbon black material.

In some embodiments, the conductive element comprises a piece of conductive material positioned upon the sensing element.

In some embodiments, the at least one physical feature comprises a protrusion shape defined by the film layer on the first and/or second side of said plastic layer, protruding into a recess in the adjacent portion of said plastic layer, thereby locally reducing the physical distance between the film layer on the second side of said plastic layer and the sensing element at the position of the sensing area.

In some embodiments, the recess shape defines an essentially hemispherical or spherical cap shape.

In some embodiments, the shape defined by the film layer comprises elongated film material resulting from 3D forming of the film, optionally thermoforming.

In some embodiments, a ground pattern or a solid reference plane is provided, optionally printed, on the film layer on the first or second side of said plastic layer to establish a self-capacitance sensing arrangement with the sensing element of the sensing electronics.

In some embodiments, the film layer on the second side of said plastic layer hosts an electrode at the position of the sensing area, configured to establish a transmitter-receiver electrode pair for mutual capacitive sensing with the sensing element of the sensing electronics, wherein the sensing element is a sensing electrode.

In some embodiments, the structure comprises at least one overlay layer, such as a protective, decorative or functional layer, on the film layer on the first or the second side of said plastic layer.

In some embodiments, the structure comprises a film bent into two substantially opposite sections defining the film layers on both sides of said plastic layer.

In some embodiments, the structure comprises a first film on the first side of said plastic layer and a second film on the second side of said plastic layer.

In some embodiments, the at least portion of the sensing electronics including the sensing element are located on a surface of the film layer that faces said plastic layer.

According to one other embodiment of the present invention, a method for manufacturing an integrated multilayer structure for sensing applications comprises:

obtaining at least one, optionally plastic, film, said at least one film comprising a sensing area; arranging said at least one film with reactance sensing electronics for sensing, such as projected capacitance or inductance sensing, of one or more selected target quantities and/or qualities and conversion thereof into representative electrical signals, said sensing electronics comprising at least one sensing element, such as a sensing electrode or a sensing coil, and an electrical connection, such as a galvanic connection element, a capacitive connection or an inductive connection, for connecting the sensing element to an associated control circuitry preferably driving the sensing element, optionally further arranging said at least one film with at least portion of the control circuitry; and molding or casting, and configuring, at least one plastic layer, preferably of electrically substantially insulating material, so that said plastic layer defines an integrated, intermediate layer between the sensing electronics and the sensing area and that the sensing area is superimposed with, optionally substantially axially aligned with, the sensing element of the sensing electronics; wherein it is further provided at least one physical feature to locally reduce the electrical distance between the sensing area and the sensing element to improve the associated sensing sensitivity.

In some embodiments, at least portion of the electronics is printed by printed electronics technology, or provided by injection molding or by dip molding.

In some embodiments, the at least one physical feature comprises an electrically conductive element provided between the sensing area and the sensing element, preferably through molding the element upon the sensing element.

In some embodiments, the provision of the at least one physical feature comprises 3D forming of said at least one film at the location of the sensing area and/or the sensing element to define a corresponding protrusion shape extending towards and overmolded by the material of said at least one molded plastic layer during molding, thereby locally reducing the thickness of the said at least one molded plastic layer as well as the physical distance between the sensing area and the sensing element.

In some embodiments, the method comprises providing a first film of said at least one film and arranging it with the sensing electronics, providing a second film of said at least one film, said second film defining the sensing area, providing said first and second films as inserts in a mold configured so that the sensing area and the sensing element are mutually superimposed, and molding the at least one plastic layer therebetween.

In some embodiments, the at least one film comprises a film that is bent so that the sensing area defined thereon and the sensing element arranged thereon are mutually superimposed, and molding the at least one plastic layer therebetween.

In some embodiments, the method comprises provision of an overlay layer, such as a protective, decorative or functional layer, optionally comprising electrical elements or functionalities, upon the at least one film and the sensing area thereof.

In some embodiments, at least portion of the electronics is printed electronics and established by a selected printed electronics technology, or provided by injection molding or by dip molding, for example.

In various embodiments, the at least one physical feature comprises an electrically conductive element provided between the touch area and the electrode, preferably through molding the element upon the electrode.

In some embodiments, the provision of the at least one physical feature comprises 3D forming of said at least one film at the location of the sensing area and/or the electrode to define a corresponding protrusion shape extending towards and overmolded by the material of said at least one molded plastic layer during molding, thereby locally reducing the thickness of the said at least one molded plastic layer as well as the physical distance between the sensing area and the electrode.

In various embodiments, the method comprises providing a first film of said at least one film and arranging it with the sensing electronics, providing a second film of said at least one film, said second film defining the sensing area, providing said first and second films as inserts in a mold configured so that the sensing area and the electrode are mutually superimposed, and molding the at least one plastic layer therebetween. In some embodiments, at least a corresponding portion of the plastic layer with respect to the sensing area is preferably elastic.

In an embodiment, the at least one film comprises a film that is bent so that the sensing area defined thereon and the electrode arranged thereon are mutually superimposed, and molding the at least one plastic layer therebetween.

In various embodiments, the method comprises provision of an overlay layer, such as a protective, decorative or functional layer, upon the at least one film and the sensing area thereof.

In various additional or supplementary embodiments, the film is essentially planar or exhibits at least locally an essentially three-dimensional shape, optionally curved, angled, slanted or dome shape.

In various additional or supplementary embodiments, the film(s) may comprise or consist of material(s) such as plastics, e.g. thermoplastic polymer, and/or organic or biomaterials with reference to e.g. wood, leather or fabric, or a combination of any of these materials with each other or with plastics or polymers or metals. The substrate film may comprise or consist of thermoplastic material. The film may be essentially flexible or bendable. In some embodiments, the film may alternatively be substantially rigid. The thickness of the film may vary depending on the embodiment; it may only be of few tenths or hundredths of a millimeter, or considerably thicker, in the magnitude of one or few millimeter(s), for example.

The film may, for example, comprise at least one material selected from the group consisting of: polymer, thermoplastic material, electrically insulating material, PMMA (Polymethyl methacrylate), Polycarbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

In a further, either supplementary or alternative, embodiment one or more of the included films may at least partially be optically substantially opaque or at least translucent having regard to predefined wavelengths e.g. in visible spectrum. The film may have been provided with visually distinguishable, decorative/aesthetic and/or informative, features such as graphical pattern and/or color thereon or therein. The features may have been provided on the same side of the film with the electronics so that they have been also at least partially sealed by the plastic material(s) through the associated overmolding procedure. Accordingly, IML (in-mold labeling)/IMD (in-mold decoration) technique is applicable. The film(s) may be at least partially, i.e. at least in places, optically substantially transparent to radiation such as visible light emitted by the electronics thereon. The transmittance may be about 80%, 85%, 90%, 95% or higher, for example.

The plastic layer(s) molded onto the film(s) may comprise materials such as polymer, organic, biomaterial, composite as well as any combination thereof. The molded material may comprise thermoplastic and/or thermosetting material(s). Thickness of the molded layer(s) may vary depending on the embodiment. It may be, for example, in the order of magnitude of one, few or tens of millimeters. The molded material may be e.g. electrically insulating.

In more detail, the at least one molded plastic layer may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In various additional or supplementary embodiments, electrically conductive areas and/or sensing element(s) and/or coils or electrodes comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

The visual features such as patterns or coloring may be provided via internal layers, e.g. on the side of a (substrate) film that is facing the molded plastics so that the features remain isolated and thus protected from environmental effects at least by the thickness of the film and optionally of the molded layer depending on which side the film was provided relative to the environmental threat. Accordingly, different impacts, rubbing, chemicals, etc. that could easily damage e.g. painted, printed or mounted surface features do not affect or reach the features. The film may be easily manufactured or processed, optionally cut, into a desired shape with necessary characteristics such as holes or notches for exposing the underlying features such as the molded material.

The utility of the present invention arises from a plurality of issues depending on the embodiment. Reactance sensing, such as capacitive or inductive touch detection, is based on changes in reactance, such as essentially in capacitance or in inductance. With various embodiments of the present invention the change e.g. in total reactance is much higher than in known solutions when an object is arranged to the sensing area. By at least locally reducing the electrical distance between the sensing element and the sensing area, the associated sensing sensitivity is improved while at the same time, the distance of, for example, the electrical connection between the sensing element and the control circuitry thereof is kept long enough from the sensing area to reduce interferences. The expression "a number of" may herein refer to any positive integer starting from one (1). The expression "a plurality of" may refer to any positive integer starting from two (2), respectively. The terms "first" and "second" are herein used to distinguish one element from other element, and not to specially prioritize or order them, if not otherwise explicitly stated.

When "different" or "various" embodiments of the multilayer structure, related method of manufacture, or features included therein are referred to herein, the embodiments are to be considered mutually supplementary and may thus be realized in common embodiments, unless being otherwise explicitly stated or otherwise clear to a person skilled in the art that the concerned solutions are mutually clearly exclusive alternative solutions for implementing the very same feature of the solution.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION OF SOME EMBODIMENTS

Figure 1A:
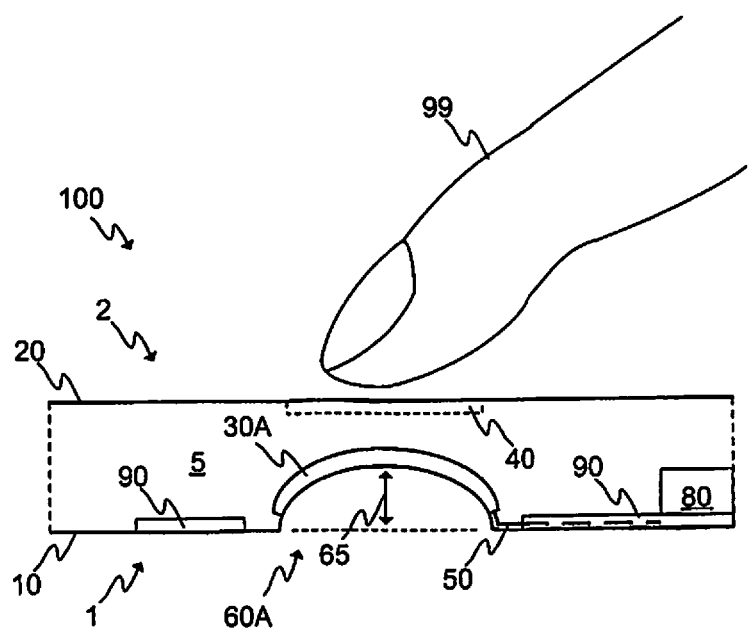
FIG. 1A illustrates, via a side view, an embodiment of an integrated multilayer structure in accordance with the present invention.
Figure 1B:
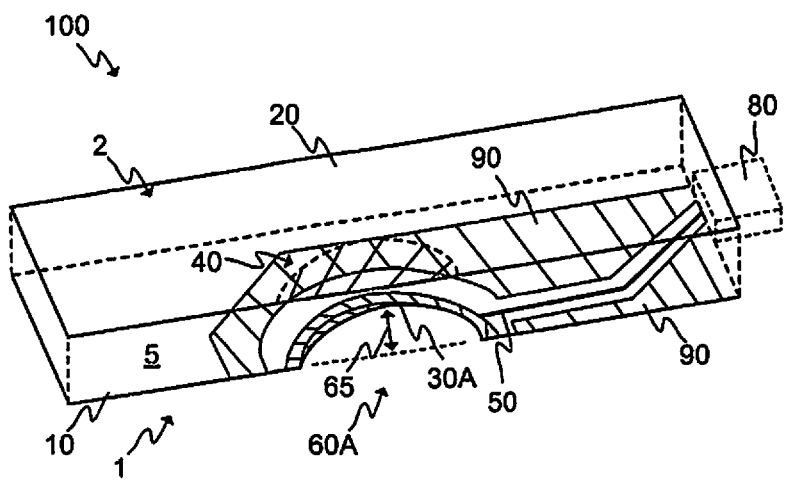
FIG. 1B illustrates, via a perspective view, the embodiment of FIG. 1A.

FIGS. 1A and 1B illustrate, via a (cross-sectional) side view, an embodiment of an integrated multilayer structure 100 in accordance with the present invention.

The multilayer structure 100 may establish an end product per se, e.g. an electronic device, or be disposed in or at least connected to a host device, host system or host structure as an aggregate part or module, for example. The structure 100 may comprise a number of other elements or layers not explicitly shown in the figure for clarity reasons.

In FIGS. 1A (a side view) and 1B (a perspective view), the integrated multilayer structure 100 for use in sensing applications, optionally in the sensing of touch, proximity, gesture, force, pressure, strain, substance, such as fluid, surface level or flow, the multilayer structure comprises at least one molded or cast plastic layer 5, preferably of electrically substantially insulating material, having a first 1 and an opposing second side 2. The structure may further comprise film layer 10, 20 on both first 1 and second 2 sides of said plastic layer 5.

The film layer 10 on the first side 1 of said plastic layer 5 may be provided with reactance sensing electronics for reactance or reactive, such as projected capacitance or inductance, sensing of one or more selected target quantities and/or qualities and conversion thereof into representative electrical signals. The sensing electronics may comprise at least one sensing element 30A, such as especially a sensing electrode for capacitive sensing, optionally printed upon the film layer 10, and an electrical connection 50, preferably a galvanic connection element or a capacitive connection or an inductive connection, for connecting the sensing element 30A to an associated control circuitry 80, which, preferably drives (controls) the sensing element 30A. Said structure 100 may optionally host at least part of the control circuitry 80.

The film layer 10 may form e.g. one layer of a multilayer structure, such as having at least two layers. The other layers may be, for example, laminated on the film layer 10. It may even be so that the film layer 10 does not define or represent the most outermost layer of the multilayer structure but rather it may be laminated, for instance, on both sides of the film layer 10.

The film layer 20 on the second side 2 of said plastic layer 5 has or at least part of it defines a sensing area 40 superimposed with, optionally substantially axially aligned with, the sensing element 30A of the sensing electronics. Furthermore, the electrical distance between the film layer 20 on the second side 2 of said plastic layer 5 and the sensing element 30A may be locally reduced by at least one physical feature at the position of the sensing area 40 of the film layer 10 to improve the associated sensing sensitivity. The reactance sensing electronics may be arranged to measure the presence of a finger 99 near or in contact with the sensing area 40.

In some embodiments, at least a (corresponding) portion of the plastic layer 5 with respect to the sensing area 40 is preferably elastic. Such a structure 100 having the elastic portion may thus be used for indirect measuring of force being applied to the sensing area 40.

In FIGS. 1A and 1B, the at least one physical feature is a recess 60A into the molded or cast plastic layer 5 having a depth 65. The depth 65 may be, for example, 25 to 95% of the total thickness of the plastic layer 5. The depth 65 may preferably be such that the sensing element 30A fits between the film layer 20 on the second side 2 and the bottom of the recess 60A.

According to another embodiment, there may be a recess into the plastic layer 5 at the position of the sensing area 40. According to an embodiment, there may be recesses at the position of the sensing area 40 in both film layers 10, 20.

In some embodiments, a ground pattern 90 or a solid reference plane 90 may be provided, optionally printed, on the film layer on the first or second side of said plastic layer to establish a self-capacitance sensing arrangement with the sensing element of the sensing electronics.

In some embodiments, the at least one physical feature comprises a protrusion shape defined by the film layer on the first and/or second side of said plastic layer, protruding into a recess in the adjacent portion of said plastic layer, thereby locally reducing the physical distance between the film layer on the second side of said plastic layer and the sensing element at the position of the sensing area. In some embodiments, the recess shape defines an essentially hemispherical or spherical cap shape. In some other embodiments, the shape defined by the film layer comprises elongated film material resulting from 3D forming of the film, optionally thermoforming.

In an embodiment, the film layer on the second side of said plastic layer hosts an electrode at the position of the sensing area, configured to establish a transmitter-receiver electrode pair for mutual capacitive sensing with the sensing element of the sensing electronics, wherein the sensing element is a sensing electrode.

In various embodiments, the structure 100 comprises at least one overlay layer, such as a protective, decorative or functional layer, on the film layer on the first or the second side of said plastic layer.

According to various embodiments, the structure 100 may comprise a first film 10 on the first side 1 of said plastic layer 5 and a second film 20 on the second side 2 of said plastic layer 5. Preferably, the first 10 and the second 20 films are different, separate films.

In various embodiments, the at least portion of the sensing electronics including the sensing element 30A are located on a surface of the film layer that faces said plastic layer.

Generally, the multilayer 100 structure may also comprise or implement e.g. at least one electronic component, other functional element or other feature selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, data storage element, electronic sub-assembly, light directing element, lightguide, lens and reflector.

Figure 2A:
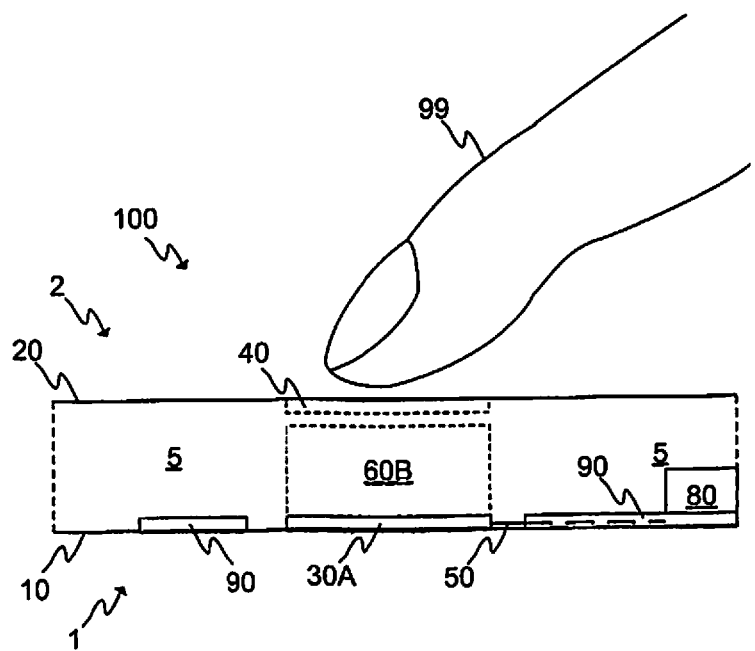
FIG. 2A illustrates, via a side view, an embodiment of an integrated multilayer structure in accordance with the present invention.
Figure 2B:
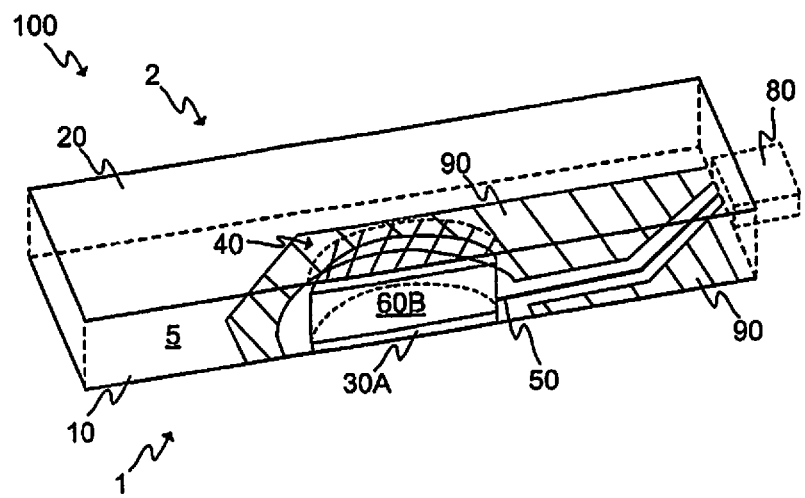
FIG. 2B illustrates, via a perspective view, the embodiment of FIG. 2A.

FIGS. 2A and 2B illustrate, via a (cross-sectional) side view and a perspective view, an embodiment of an integrated multilayer structure 100 in accordance with the present invention.

FIGS. 2A and 2B are similar to FIGS. 1A and 1B, respectively. However, in FIGS. 2A and 2B, the at least one physical feature is an electrically conductive element 60B molded, such as injection molded, or cast into the plastic layer 5. Preferably, the at least one physical feature comprises an electrically conductive element 60B substantially within said plastic layer 5, connecting to the sensing element 30A. In some embodiments, the conductive element 60B comprises resin molded upon the sensing element. The conductive element 60B may comprise a piece of conductive material positioned upon the sensing element 30A. The electrically conductive element 60B may define part of the sensing element 30A of the reactance sensing electronics. Said electrically conductive element 60B may be molded into a recess defined by the plastic layer 5.

Figure 3A:
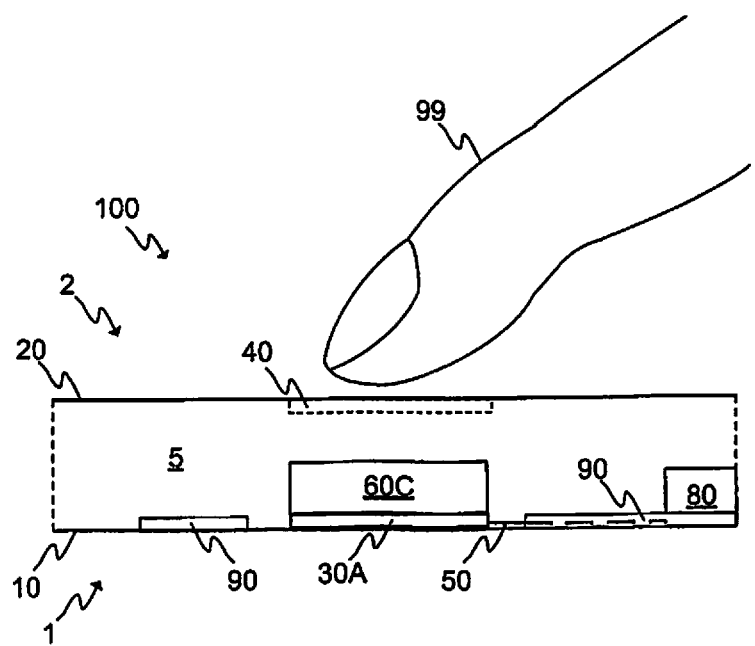
FIG. 3A illustrates, via a side view, an embodiment of an integrated multilayer structure in accordance with the present invention.
Figure 3B:
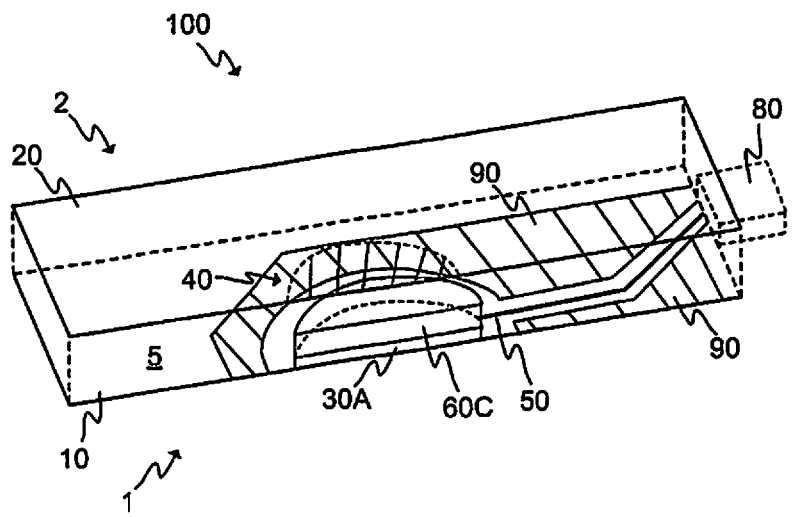
FIG. 3B illustrates, via a perspective view, the embodiment of FIG. 3A.

FIGS. 3A and 3B illustrate, via a (cross-sectional) side view and a perspective view, an embodiment of an integrated multilayer structure 100 in accordance with the present invention.

FIGS. 3A and 3B are similar to FIGS. 1A and 1B, respectively. However, in FIGS. 3A and 3B, the at least one physical feature is an electrically conductive element of a piece of conductive material 60C positioned upon the sensing element 30A.

Figure 3C:
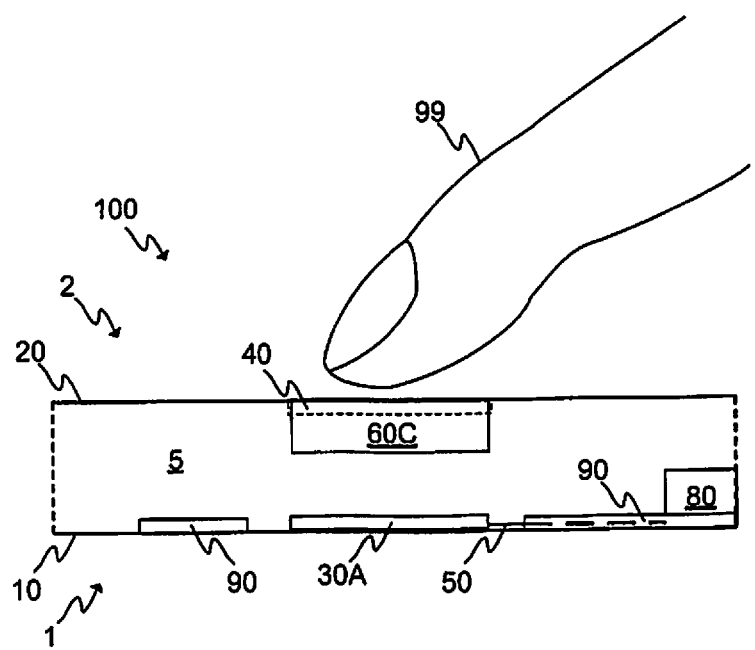
FIG. 3C illustrates, via a side view, an embodiment of an integrated multilayer structure in accordance with the present invention.
Figure 3D:
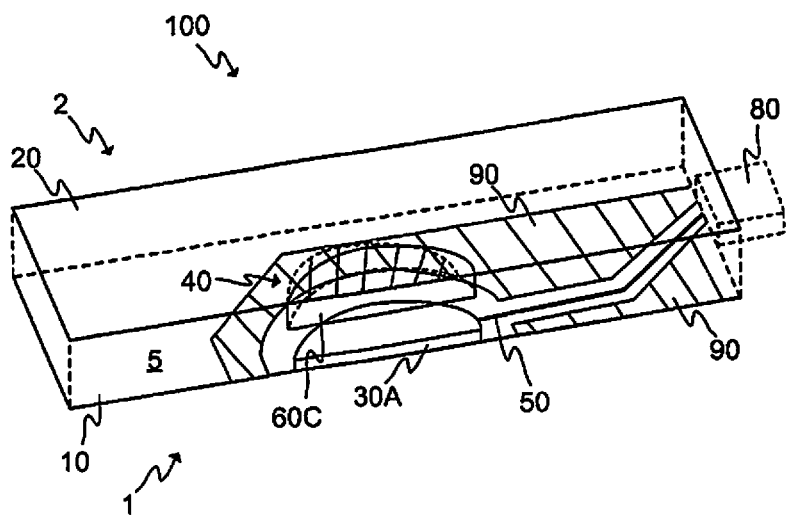
FIG. 3D illustrates, via a perspective view, the embodiment of FIG. 3C.

FIGS. 3C and 3D illustrate, via a (cross-sectional) side view and a perspective view, an embodiment of an integrated multilayer structure 100 in accordance with the present invention.

FIGS. 3C and 3D are otherwise similar to FIGS. 3A and 3B, respectively. However, in FIGS. 3C and 3D, the at least one physical feature may be an electrically conductive element of a piece of conductive material 60C or it may be an electrically conductive element 60B arranged on the inner surface of the film layer, that is within the molded or cast plastic layer, on the second side of said plastic layer at the position of the sensing area of the film layer to improve the associated sensing sensitivity the sensing element 30A.

Figure 4A:
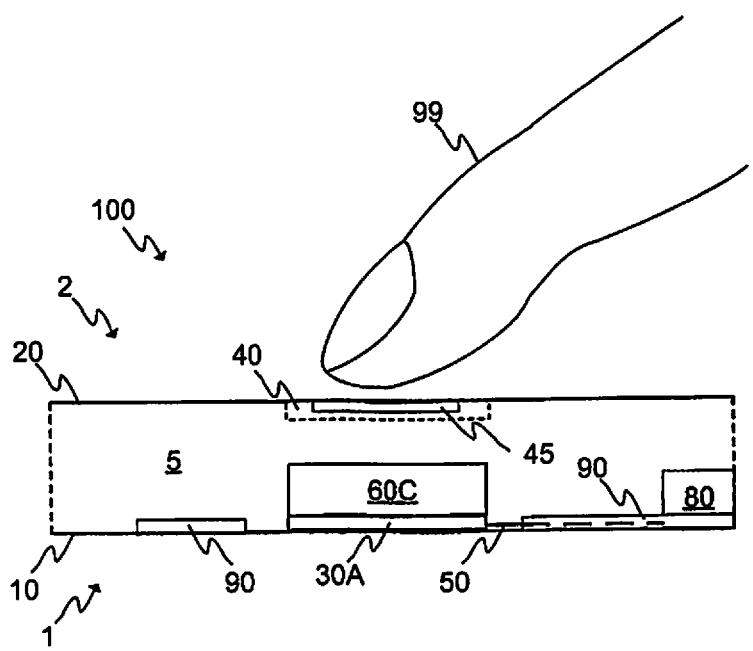
FIG. 4A illustrates, via a side view, an embodiment of an integrated multilayer structure in accordance with the present invention.
Figure 4B:
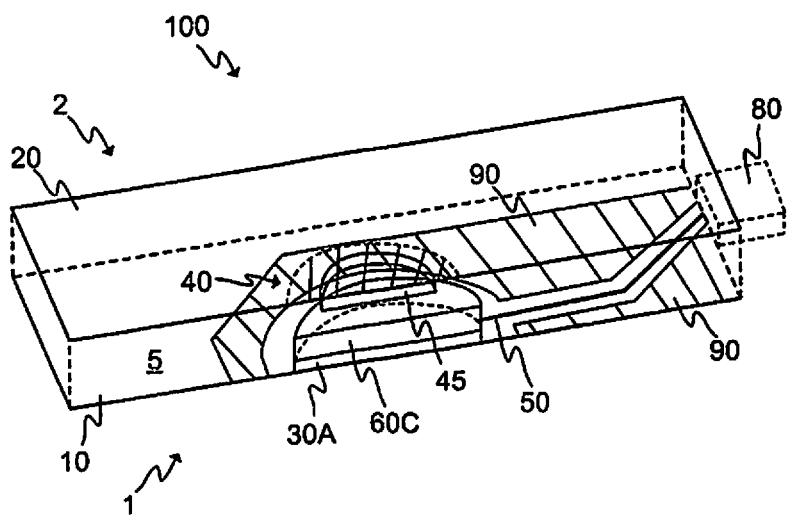
FIG. 4B illustrates, via a perspective view, the embodiment of FIG. 4A.

FIGS. 4A and 4B illustrate, via a (cross-sectional) side view and a perspective view, respectively, an embodiment of an integrated multilayer structure 100 in accordance with the present invention.

In FIGS. 4A and 4B, the at least one physical feature may be an electrically conductive element of a piece of conductive material 60C or it may be an electrically conductive element 60B arranged on the inner surface of the film layer, that is within the molded or cast plastic layer, on the first side of said plastic layer at the position of the sensing area of the film layer to improve the associated sensing sensitivity the sensing element 30A. Alternatively or in addition, the at least one physical feature may be a recess arranged at the position of the sensing area 40, such as in FIGS. 1A and 1B.

Furthermore, the structure 100 in FIGS. 4A and 4B comprises a second sensing element 45, such as a capacitive sensing element, or particularly a receiving electrode of a capacitive sensor based on the mutual capacitance between the elements thereof, arranged to a surface, such as to an inner or outer surface, of the second film 20, preferably, at the position of the sensing area 40.

The at least one physical feature, such as an electrically conductive element of a piece of conductive material 60C or it may be an electrically conductive element 60B, may be arranged on the inner surface of the film layer at the position of the sensing area of the film layer in various embodiments, such as also in ones related to FIGS. 1A and 1B, or 5A and 5B.

Figure 5A:
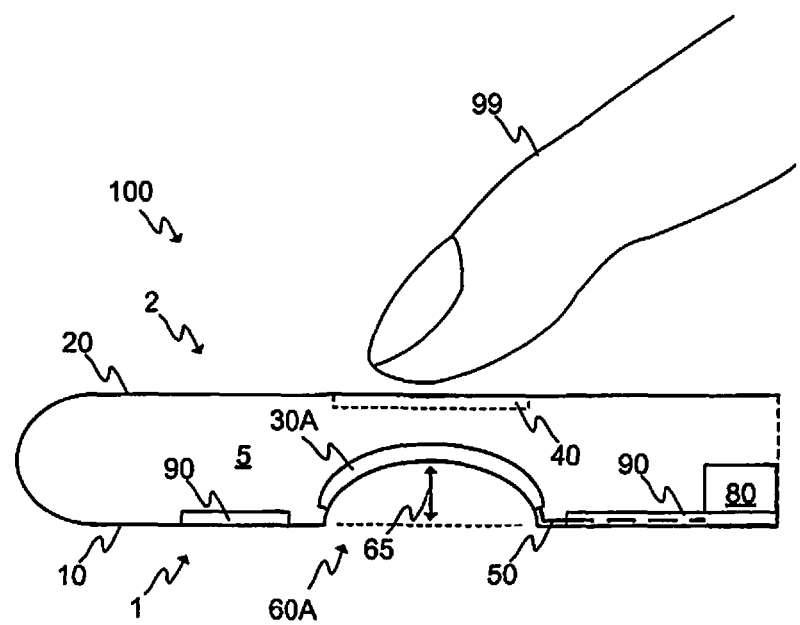
FIG. 5A illustrates, via a side view, an embodiment of an integrated multilayer structure in accordance with the present invention.
Figure 5B:
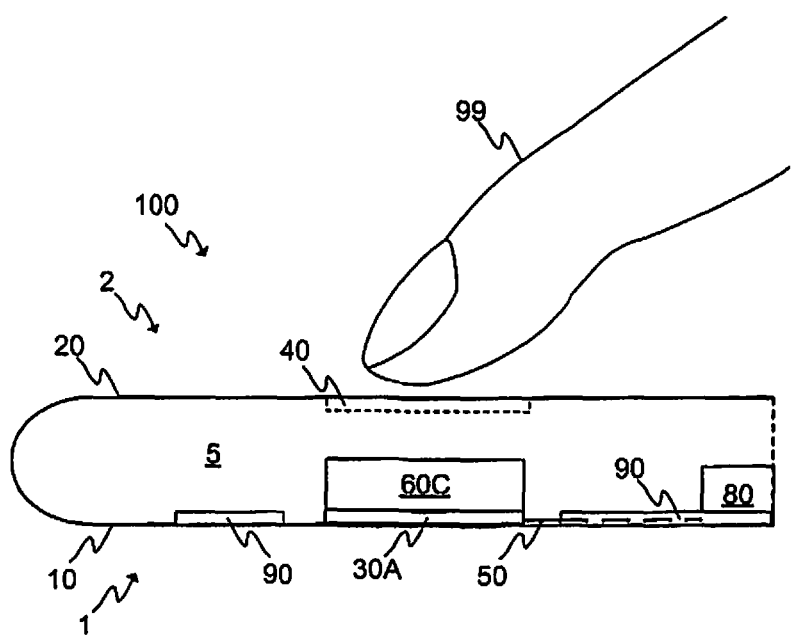
FIG. 5B illustrates, via a side view, an embodiment of an integrated multilayer structure in accordance with the present invention.

FIGS. 5A and 5B illustrate, via (cross-sectional) side views, two embodiments of an integrated multilayer structure 100 in accordance with the present invention.

FIGS. 5A and 5B are similar to FIGS. 1A and 3A, respectively. However, in the embodiments of FIGS. 5A and 5B, the structure 100 comprises only one film or film layer which is bent into two substantially opposite sections defining the film layers 10, 20, or film sections, on both sides of said plastic layer 5.

Figure 6A:
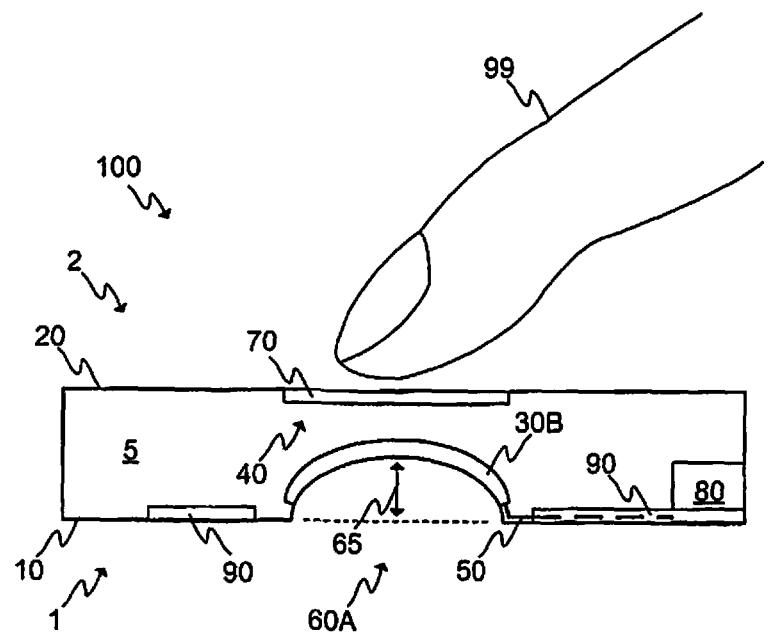
FIG. 6A illustrates, via a side view, an embodiment of an integrated multilayer structure in accordance with the present invention.
Figure 6B:
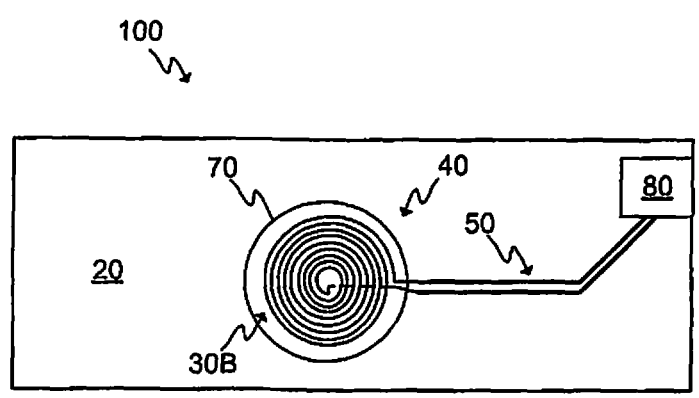
FIG. 6B illustrates, via a view from above, the embodiment of FIG. 6A.

FIGS. 6A and 6B illustrate, via a (cross-sectional) side view and a view from above, an embodiment of an integrated multilayer structure 100 in accordance with the present invention.

The film layer 10 on the first side 1 of said plastic layer 5 may be provided with reactance sensing electronics for (reactance) sensing of one or more selected target quantities and/or qualities and conversion thereof into representative electrical signals. The sensing electronics may comprise, in this particular case, at least one sensing element 30A which is a sensing coil 30B, optionally printed upon the film layer 10, and an electrical connection 50, preferably a galvanic connection element or a capacitive connection or an inductive connection, for connecting the coil 30B to an associated control circuitry 80, which, preferably drives the coil 30B. Said structure 100 may optionally host at least part of the control circuitry 80. Furthermore, there may be a target element 70, such as of solid metal. The inductive touch sensing operates by detecting a change in the characteristics of the magnetic coupling between the target 70 and said coil 30B. As shown in FIG. 6B, the at least one physical element 60A may be, for example, a recess arranged at the position of the sensing area 40, such as in FIGS. 1A and 1B.

Figure 7:
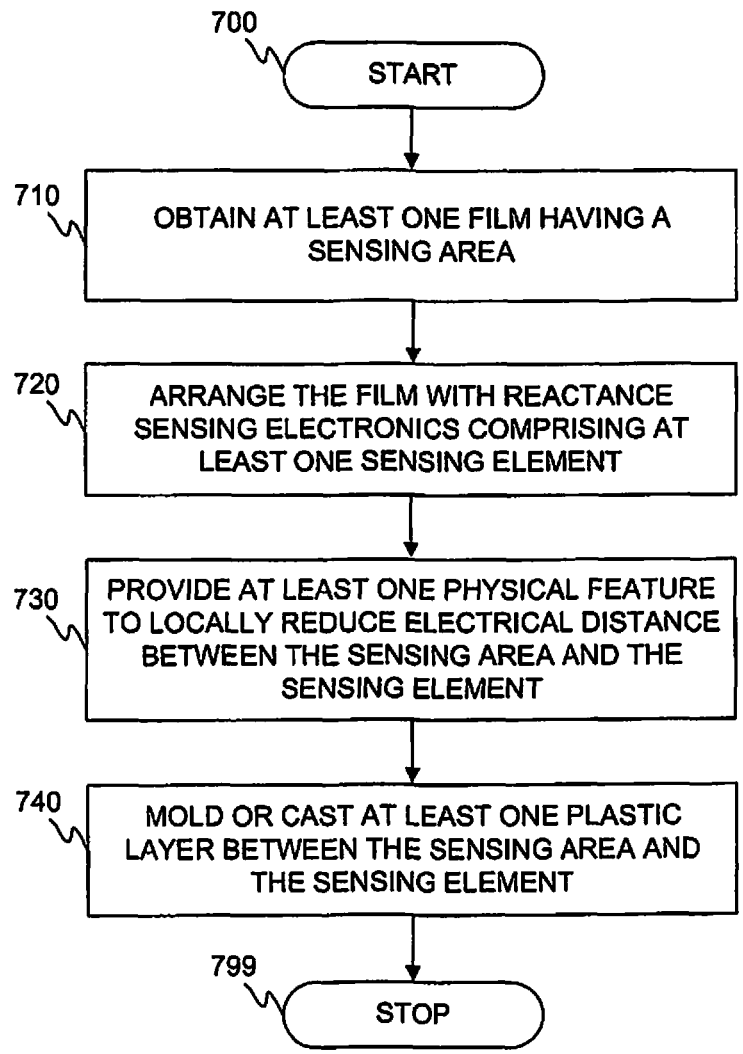
FIG. 7 is a flow diagram of an embodiment of a method in accordance with the present invention.

FIG. 7 illustrates a flow diagram of an embodiment of a method in accordance with the present invention.

At the beginning of the method for manufacturing the multilayer structure, a start-up phase 700 may be executed. During start-up, the necessary tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, electronics assembly, cutting, drilling and/or printing equipment, among others, may be thus ramped up to operational status at this stage.

At 710, at least one, optionally plastic, film 10 is obtained. Said at least one film 10 has, or at least a part of the film 10 defines, a sensing area 40, preferably particularly, a touch detection area 40 on the film 10. The film 10 may initially be substantially planar or e.g. curved. A ready-made element, e.g. a roll or sheet of plastic film, may be acquired for use as the material. In some embodiments the film itself may be first produced in-house by molding or other methods from selected starting material(s). Optionally, the film 10 may be processed further at this stage. It may be, for example, provided with holes, notches, recesses, cuts, etc.

At 720, said at least one film 10 is arranged with reactance sensing electronics for reactance, such as projected capacitance or inductance, sensing of one or more selected target quantities and/or qualities and conversion thereof into representative electrical signals. Said sensing electronics may comprise at least one sensing element 30A, such as a sensing electrode 30A or a sensing coil 30B, and an electrical connection 50, such as a galvanic connection element, a capacitive connection or an inductive connection, for connecting the sensing element 30A to an associated control circuitry 80 preferably driving the sensing element 30A, optionally further arranging said at least one film 10 with at least portion of the control circuitry 80.

In various embodiments, a number of conductive areas defining e.g. conductor lines (traces) and/or contact pads and/or electrodes to construct a circuit design are provided on the film(s), either or both sides thereof, preferably by one or more additive techniques of printed electronics technology. For example, screen, inkjet, flexographic, gravure or offset lithographic printing may be utilized. Also further actions cultivating the film(s) involving e.g. printing or generally provision of graphics, visual indicators, optical elements, etc. thereon may take place here.

At 730, at least one physical feature 60A, 60B, 60C may be provided to locally reduce the electrical distance between the sensing area 40 and the sensing element 30A to improve the associated sensing sensitivity. In embodiments in which the at least one physical feature is a recess, for instance, the recess may be formed by forming, such as thermoforming, cold-forming and vacuum forming, the recess into the film 10. The forming may, preferably, occur after providing the sensing element 30A on the film, however, it may alternatively occur before the provision of said element 30A.

At 740, molding or casting, and configuring, at least one plastic layer 5, preferably of electrically substantially insulating material, so that said plastic layer 5 defines an integrated, intermediate layer between the sensing electronics and the sensing area 40, and that the sensing area 40 is superimposed with, optionally substantially axially aligned with, the sensing element 30A, such as a sensing electrode or a coil, of the sensing electronics. In practice, the substrate film may be used as an insert in an injection molding process. One side of the substrate film may be, in some embodiments, left free from the molded plastics. In case, two films are used, both of them may be inserted in their own mold halves so that the plastic layer is injected between them. Alternatively, the second film could be attached to an aggregate of the first film and plastic layer afterwards by suitable lamination technique.

According to an embodiment, such as shown in FIGS. 5A and 5B, only one film is used for providing the film layers 10, 20. In various embodiments, two separate films 10, 20 may be used. Steps 730 and 740 may be performed in any order. For example, in case of the at least physical feature 60A being a recess, it may be provided to the layer before the molding or casting. Also, in case of the at least physical feature 60C being a piece of conductive material, it may be provided to the layer before the molding or casting. On the other hand, in case of an electrically conductive element 60B, said element 60B may be molded after or substantially simultaneously with the plastic layer 5, as stated hereinbefore.

At 799, method execution is ended.

Figure 8:
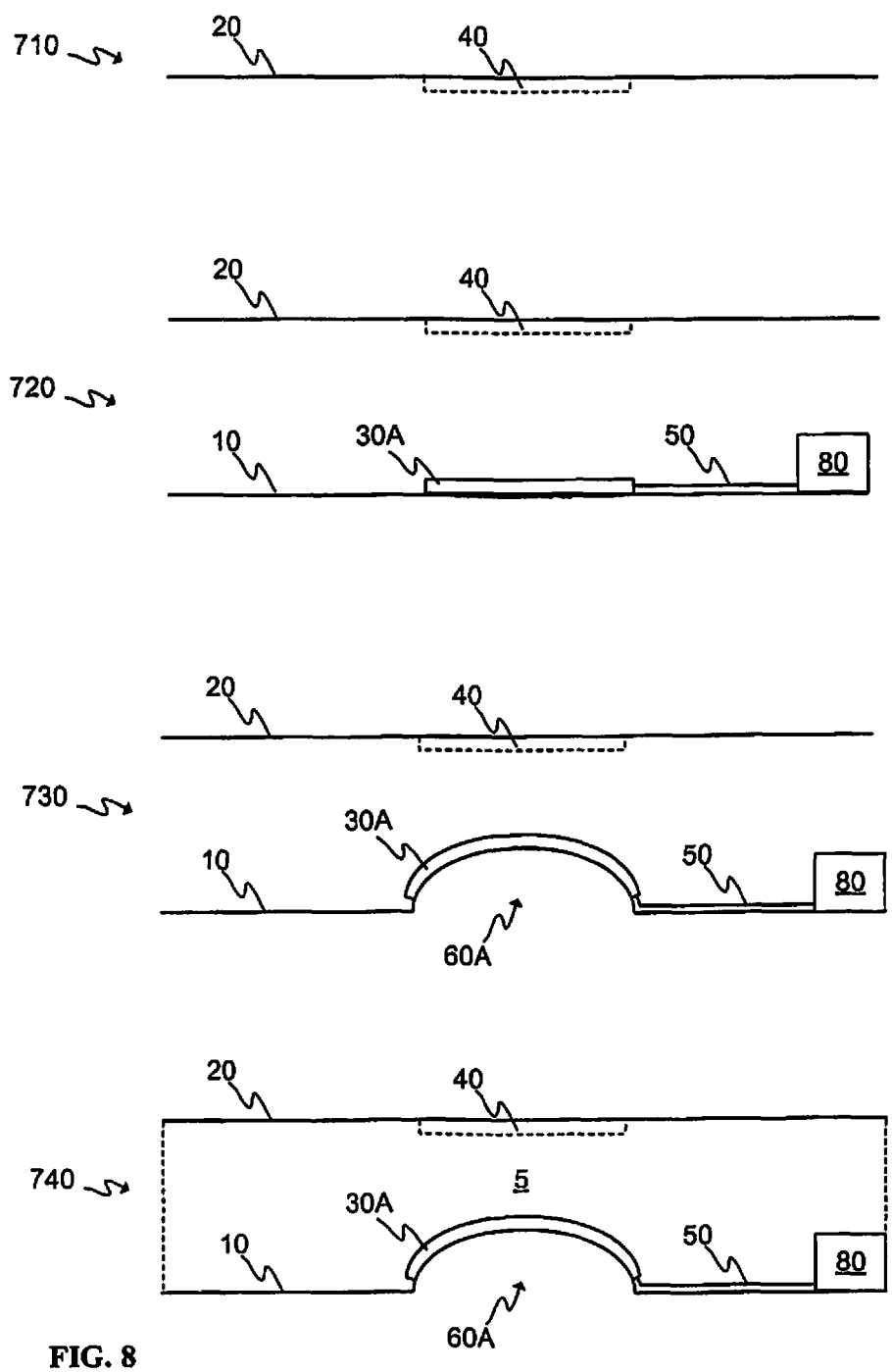
FIG. 8 illustrates different stages of the integrated multilayer structure during a method in accordance with an embodiment of the present invention.

FIG. 8 illustrates different stages of the integrated multilayer structure during a method in accordance with an embodiment of the present invention.

As can be seen, in FIG. 8, the at least one physical feature 60A is a recess extending into the plastic layer 5. At 710, at least one, optionally plastic, film 10 is obtained. Said at least one film 10 has, or at least a part of the film 10 defines, a sensing area 40, preferably particularly, a touch detection area 40 on the film 10. At 720, said at least one film 10 is arranged with reactance sensing electronics for reactance sensing. Said sensing electronics may comprise at least one sensing element 30A and an electrical connection 50, such as a galvanic connection element, for connecting the sensing element 30A to an associated control circuitry 80 preferably driving the sensing element 30A, optionally further arranging said at least one film 10 with at least portion of the control circuitry 80.

At 730, at least one physical feature 60A may be provided to locally reduce the electrical distance between the sensing area 40 and the sensing element 30A to improve the associated sensing sensitivity. The recess may be formed by forming, such as thermoforming, cold-forming and vacuum forming, the recess into the film 10. The forming may, preferably, occur after providing the sensing element 30A on the film, however, it may alternatively occur before the provision of said element 30A. At 740, molding or casting, and configuring, at least one plastic layer 5, preferably at least partially of electrically substantially insulating material, takes place so that said plastic layer 5 defines an integrated, intermediate layer between the sensing electronics and the sensing area 40, and that the sensing area 40 is substantially superimposed with, optionally substantially axially aligned with, the sensing element 30A, such as a sensing electrode or a coil, of the sensing electronics.

In some embodiments, one or more typically ready-made components including electronic components such as various SMDs may be attached to the contact areas on the film(s) e.g. by solder and/or adhesives. Alternatively or additionally, printed electronics technology may be applied to actually manufacture at least part of the components, such as OLEDs, directly onto the film(s).

The electrical connection 50, such as the galvanic connection element, may be provided on the film utilizing any feasible positioning or installation technique such as standard pick and place method/equipment (when applicable). Applicable bonding (using e.g. adhesive or other bonding substance), gluing, and/or further securing techniques may be additionally utilized. Furthermore, the connection 50 may be printed, injection molded or dip molded.

The structure 100 may also incorporate other electronics such as IC(s) and/or various components. At least part of the electronics of the multilayer structure 100 may be provided to the film(s) 10, 20 via a sub-assembly. Optionally, the sub-assembly may be at least partially overmolded by a protective plastic layer prior to attachment to the film 10, 20. For example, adhesive, pressure and/or heat may be used for mechanical bonding of the sub-assembly with the film 10, 20. Solder, wiring and conductive ink are examples of applicable options for providing electrical connections between the elements of the sub-assembly and with the remaining electrical elements on the film(s).

Regarding the resulting overall thickness of the obtained stacked multilayer structure, it depends e.g. on the used materials and related minimum material thicknesses providing the necessary strength in view of the manufacturing and subsequent use. These aspects have to be considered on case-by-case basis. For example, the overall thickness of the structure could be about 1 mm or a few millimetres, but considerably thicker or thinner embodiments are also feasible.

Further layers may be added into the multilayer structure by lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics. Additional elements such as electronics may be installed at the outer surface(s) of the structure, such as the exterior surface of the substrate. A connector element may be provided and connected to a desired external connecting element such as external connector of an external device, system or structure. For example, these two connectors may together form a plug-and-socket type connection.

In various additional or supplementary embodiments, the film(s) may comprise or consist of material(s) such as plastics, e.g. thermoplastic polymer, and/or organic or biomaterials with reference to e.g. wood, leather or fabric, or a combination of any of these materials with each other or with plastics or polymers or metals. The substrate film may comprise or consist of thermoplastic material. The film may be essentially flexible or bendable. In some embodiments, the film may alternatively be substantially rigid. The thickness of the film may vary depending on the embodiment; it may only be of few tenths or hundredths of a millimeter, or considerably thicker, in the magnitude of one or few millimeter(s), for example.

The film may, for example, comprise at least one material selected from the group consisting of: polymer, thermoplastic material, electrically insulating material, PMMA (Polymethyl methacrylate), Polycarbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

In a further, either supplementary or alternative, embodiment one or more of the included films may at least partially be optically substantially opaque or at least translucent having regard to predefined wavelengths e.g. in visible spectrum. The film may have been provided with visually distinguishable, decorative/aesthetic and/or informative, features such as graphical pattern and/or color thereon or therein. The features may have been provided on the same side of the film with the electronics so that they have been also at least partially sealed by the plastic material(s) through the associated overmolding procedure. Accordingly, IML (in-mold labeling)/IMD (in-mold decoration) technique is applicable. The film(s) may be at least partially, i.e. at least in places, optically substantially transparent to radiation such as visible light emitted by the electronics thereon. The transmittance may be about 80%, 85%, 90%, 95% or higher, for example.

The plastic layer(s) molded onto the film(s) may comprise materials such as polymer, organic, biomaterial, composite as well as any combination thereof. The molded material may comprise thermoplastic and/or thermosetting material(s). Thickness of the molded layer(s) may vary depending on the embodiment. It may be, for example, in the order of magnitude of one, few or tens of millimeters. The molded material may be e.g. electrically insulating.

In more detail, the at least one molded plastic layer may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In various additional or supplementary embodiments, electrically conductive areas and/or sensing element(s) and/or coils or electrodes comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

The visual features such as patterns or coloring may be provided via internal layers, e.g. on the side of a (substrate) film that is facing the molded plastics so that the features remain isolated and thus protected from environmental effects at least by the thickness of the film and optionally of the molded layer depending on which side the film was provided relative to the environmental threat. Accordingly, different impacts, rubbing, chemicals, etc. that could easily damage e.g. painted, printed or mounted surface features do not affect or reach the features. The film may be easily manufactured or processed, optionally cut, into a desired shape with necessary characteristics such as holes or notches for exposing the underlying features such as the molded material.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of or in addition to molding the plastics directly onto the substrate, a plastic layer could be prepared upfront and then attached to the substrate by suitable lamination technique applying e.g. adhesive, mechanical attachment means (screws, bolts, nails, etc.), pressure and/or heat. Finally, in some scenarios, instead of molding or casting, the plastic or other layer of similar function could be produced on the substrate using a suitable deposition or further alternative method. Yet, instead of printed traces, the traces could be produced/provided otherwise. E.g. a conductor film manufactured utilizing etching, among other options, could be applied.

The invention claimed is:

1. A method for manufacturing an integrated multilayer structure for sensing applications, comprising:
    obtaining at least one film comprising a sensing area, the at least one film including a top film and a bottom film;
    arranging the at least one film with reactance sensing electronics for sensing of one or more selected target quantities or qualities and conversion thereof into representative electrical signals, the reactance sensing electronics comprising at least one sensing element and an electrical connection configured to connect the at least one sensing element to an associated control circuitry;
    arranging the at least one film so that the top film is positioned closer to a user than the bottom film;
    molding or casting, and configuring, at least one plastic layer with a recess defined therein so that the at least one plastic layer defines an integrated, intermediate layer between the reactance sensing electronics and the sensing area and that the sensing area is superimposed with the at least one sensing element of the reactance sensing electronics; and
    thermoforming at least one physical feature in a first portion of the bottom film at a location of the sensing area such that the at least one physical feature of the at least one film maintains a protrusion shape that extends from a second portion of the bottom film into the recess of the at least one plastic layer to retain the at least one sensing element on the at least one physical feature and in the recess at a position spaced a distance from the sensing area sufficient to improve a sensing sensitivity of the at least one sensing element and to locally and permanently reduce an electrical distance between the sensing area and the at least one sensing element.

2. The method of claim 1, wherein at least a portion of the reactance sensing electronics is printed by printed electronics technology, or provided by injection molding or by dip molding.

3. The method of claim 1, wherein the at least one physical feature comprises an electrically conductive element provided between the sensing area and the at least one sensing element.

4. The method of claim 1, wherein thermoforming the at least one physical feature comprises 3D forming of the at least one film at the location of the sensing area or the at least one sensing element to define the corresponding protrusion shape such that the protrusion shape extends towards and is overmolded by a material of the at least one plastic layer during molding thereof, thereby locally reducing a thickness of the at least one plastic layer when molded as well as a physical distance between the sensing area and the at least one sensing element.

5. The method of claim 1, comprising providing a first film of the at least one film and arranging it with the reactance sensing electronics, providing a second film of the at least one film, the second film defining the sensing area, providing the first and second films as inserts in a mold configured so that the sensing area and the at least one sensing element are mutually superimposed, and molding the at least one plastic layer between the sensing area and the at least one sensing element, wherein at least a corresponding portion of the at least one plastic layer with respect to the sensing area is elastic.

6. The method of claim 1, wherein the at least one physical feature is bent so that the sensing area and the at least one sensing element arranged on the at least one physical feature are mutually superimposed, and molding the at least one plastic layer between the sensing area and the at least one sensing element.

7. The method of claim 1, comprising provision of an overlay layer upon the at least one film and the sensing area thereof.

8. The method of claim 1, wherein arranging the at least one film with reactance sensing electronics includes arranging the bottom film with the at least one sensing element.

9. The method of claim 8, further comprising positioning the bottom film on a lower portion of the at least one plastic layer so that the at least one sensing element is positioned to align with the recess of the at least one plastic layer, and positioning the top film on an upper portion of the at least one plastic layer, the top film including the sensing area.

10. The method of claim 9, wherein molding or casting, and configuring, at least one plastic layer includes providing the recess with open space arranged within the at least one plastic layer and positioned below the protrusion shape of the at least one physical feature thermoformed in the bottom film.

11. The method of claim 1, further comprising maintaining the second portion of the at least one film in a planar configuration when the at least one physical feature is thermoformed into the protrusion shape, which is a non-planar configuration.

12. The method of claim 11, wherein the at least one physical feature is only thermoformed in the first portion of the at least one film.

13. The method of claim 1, wherein maintaining the protrusion shape includes maintaining the at least one physical feature in the protrusion shape permanently.

* * * * *